(12) United States Patent
Cunningham et al.

(10) Patent No.: US 8,730,678 B1
(45) Date of Patent: May 20, 2014

(54) CABLE MANAGEMENT APPARATUS

(75) Inventors: W. Brian Cunningham, Westborough, MA (US); Albert F. Beinor, Jr., Sutton, MA (US); Jeffrey M. Lewis, Maynard, MA (US)

(73) Assignee: EMC Corporation, Hopkinton, MA (US)

( * ) Notice: Subject to any disclaimer, the term of this patent is extended or adjusted under 35 U.S.C. 154(b) by 249 days.

(21) Appl. No.: 13/250,769

(22) Filed: Sep. 30, 2011

(51) Int. Cl.
*H05K 7/16* (2006.01)
(52) U.S. Cl.
USPC ......................................... 361/725; 174/72 A
(58) Field of Classification Search
USPC ............. 174/69, 72 A, DIG. 9; 361/725, 727, 361/826, 724; 439/719; 379/327; 211/26
See application file for complete search history.

(56) References Cited

U.S. PATENT DOCUMENTS

| | | | |
|---|---|---|---|
| 6,327,139 B1 * | 12/2001 | Champion et al. | 361/608 |
| 7,473,846 B2 * | 1/2009 | Doerr et al. | 174/69 |
| 8,216,004 B2 * | 7/2012 | Follingstad et al. | 439/719 |
| 2003/0026084 A1 * | 2/2003 | Lauchner | 361/826 |
| 2006/0162948 A1 * | 7/2006 | Rinderer et al. | 174/50 |

* cited by examiner

*Primary Examiner* — Yuriy Semenenko
(74) *Attorney, Agent, or Firm* — Krishnendu Gupta; Konrad R. Lee

(57) ABSTRACT

An apparatus and system for facilitating access to one or more components mounted in a rack comprising a base member and at least one pivot mechanism mounting the base member to the rack. The apparatus facilitates access to the components by being pivotable downward for access to upper components and pivotable upward for access to lower components.

9 Claims, 15 Drawing Sheets

CABLE MANAGEMENT APPARATUS

FIELD

The disclosure is directed to an apparatus and system for facilitating access to components, generally applicable to rack mounted assemblies

BACKGROUND

This disclosure relates to cable management systems used to manage cabling in a rack. Traditionally, cables are statically mounted to a rack or the enclosures mounted in the rack, which can result in bundles of cabling running across the rack or enclosures that prohibit easy access to enclosures and components within.

SUMMARY

An apparatus and system for facilitating access to one or more components mounted in a rack comprising a base member and at least one pivot mechanism mounting the base member to the rack. The apparatus facilitates access to the components by being pivotable downward for access to upper components in an associated enclosure and pivotable upward for access to lower components in the associated enclosure.

BRIEF DESCRIPTION OF THE DRAWINGS

Objects, features, and advantages of embodiments disclosed herein may be better understood by referring to the following description in conjunction with the accompanying drawings. The drawings are not meant to limit the scope of the claims included herewith. For clarity, not every element may be labeled in every figure. The drawings are not necessarily to scale, emphasis instead being placed upon illustrating embodiments, principles, and concepts. Thus, features and advantages of the present disclosure will become more apparent from the following detailed description of exemplary embodiments thereof taken in conjunction with the accompanying drawings in which:

DETAILED DESCRIPTION

Figure 1:
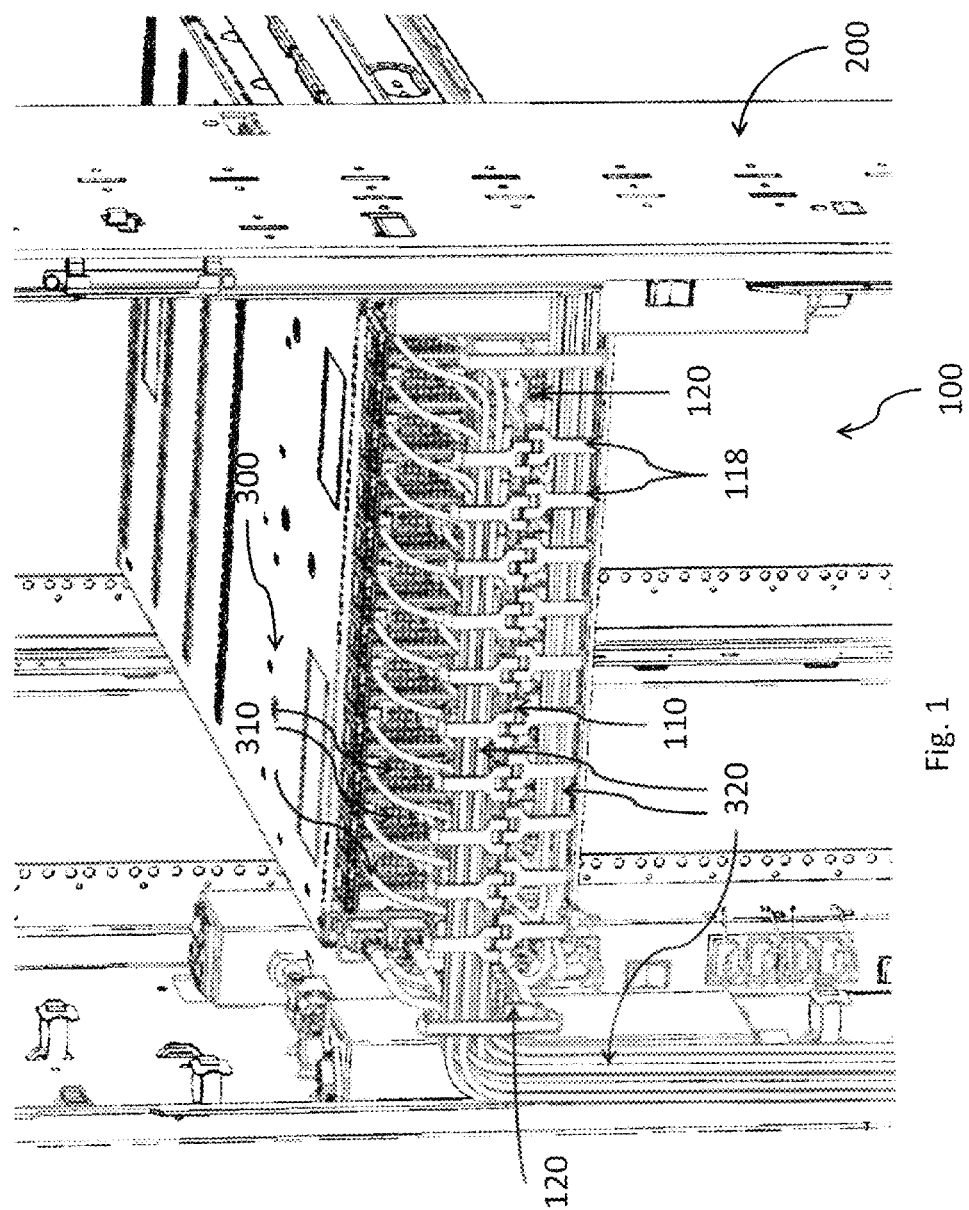
FIG. 1 illustrates a view of one embodiment of the apparatus installed in a rack.

Referring to the example embodiment in FIG. 1, an apparatus 100 is shown installed into a rack 200. An enclosure 300 is mounted within rack 200 proximate apparatus 100. Apparatus 100 is constructed and configured to manage cabling 320 for one or more components 310 mounted within enclosure 300. In this embodiment, the enclosure 300 has a first (upper) and second (lower) row of one or more components 310. As shown, one or more cable retention clips 118 are used to hold the cabling 320 to base member 110 of the apparatus 100.

Figure 2:
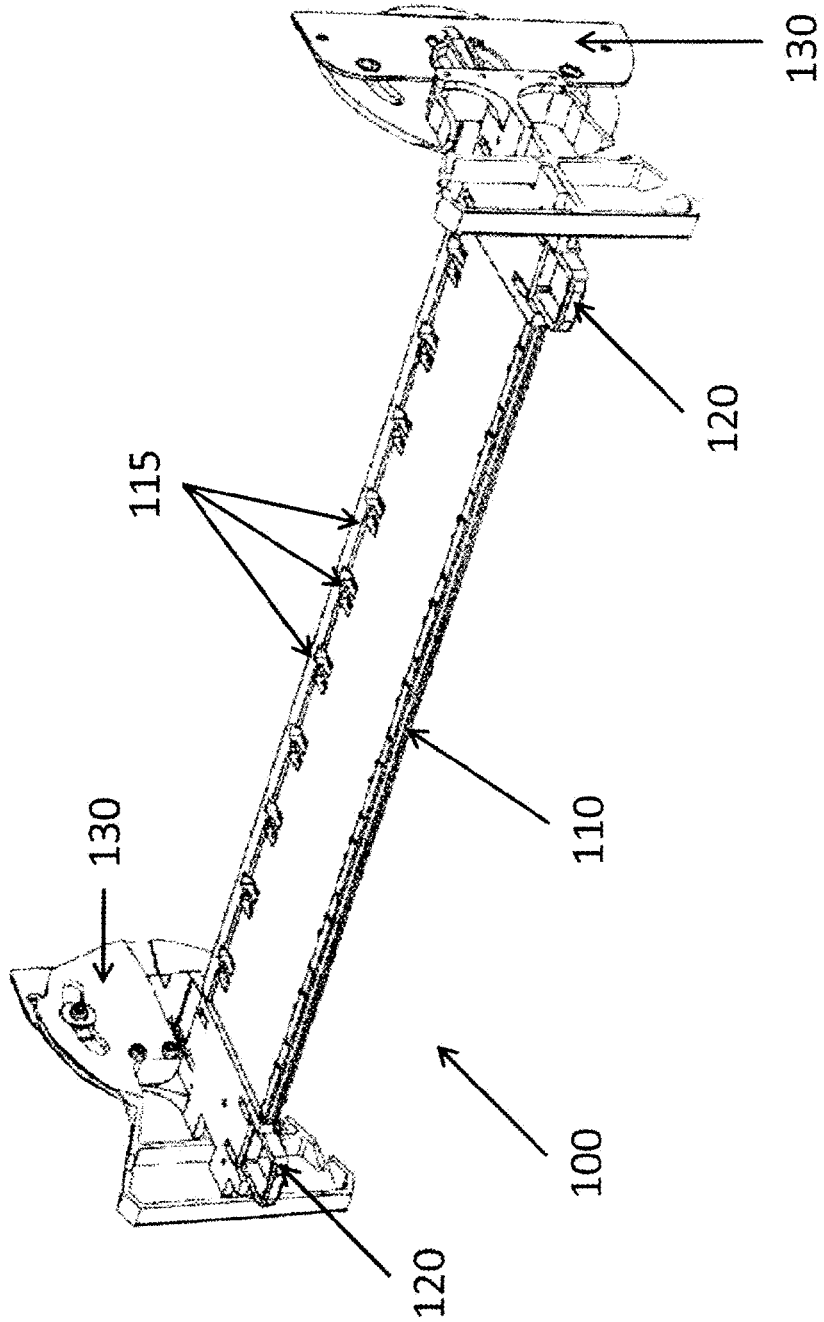
FIG. 2 illustrates a perspective view of an embodiment of the apparatus with its cable retention clips removed for clarity.

Referring to the example embodiment in FIG. 2, apparatus 100 is shown removed from rack 200 for clarity. Apparatus 100 comprises base member 110, pivot mechanisms 130, and a locking handle 120 associated with each pivot mechanism 130, mounted at each end of base member 110. As shown in this embodiment, the base member 110 includes attachment slots 115 for receiving attachments such as cable retention clips 118 (FIG. 1). While the description below pertains to only one of the pivot mechanisms 130, it will be understood that the opposing mechanism operates in a similar manner.

Figure 3:
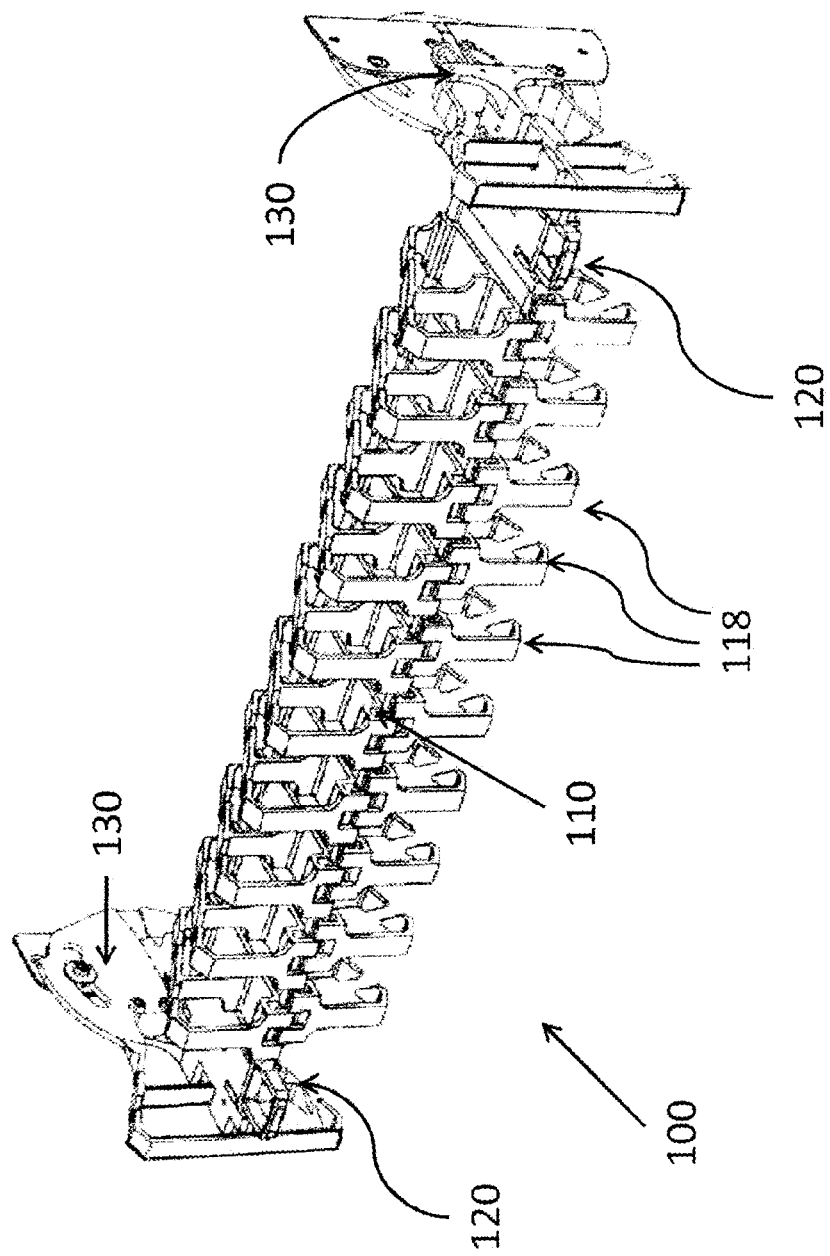
FIG. 3 illustrates a perspective view of an embodiment of the apparatus with cable retention clips.

Referring to FIG. 3, apparatus 100 is shown with cable retention clips 118 mounted on base member 110. Although twenty cable retention clips 118 are shown mounted to base member 110, it should be understood that any number of cable retention clips 118 may be utilized, including zero. Further, although cable retention clips 118 are shown, one skilled in the art will recognize that there are many mechanisms capable of securing cables 320 (FIG. 1) to the base member 110, such as, but not limited to, twist ties, zip ties, clamps, and other securing devices.

Figure 4:
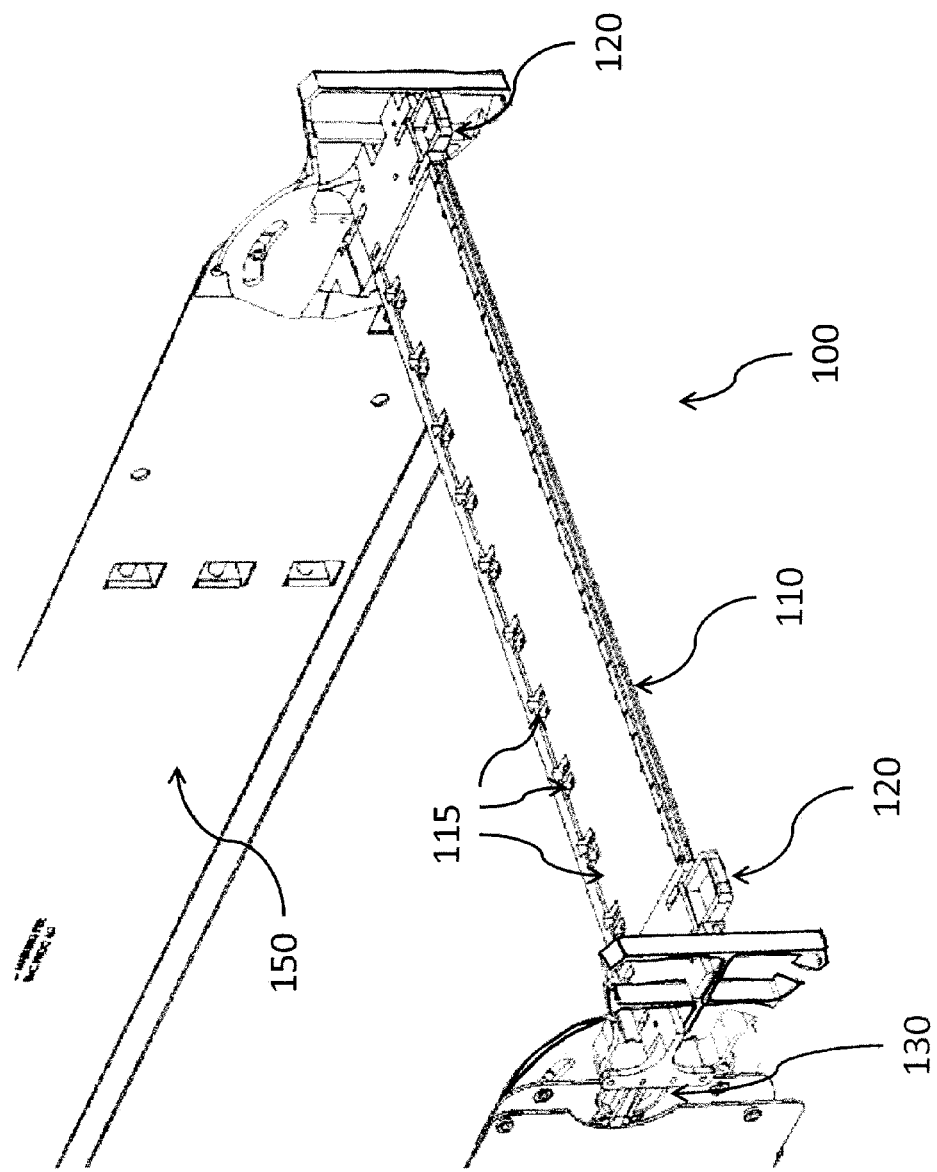
FIG. 4 illustrate perspective views of an embodiment of the apparatus mounted onto a mounting rail without cable retention clips.
Figure 5:
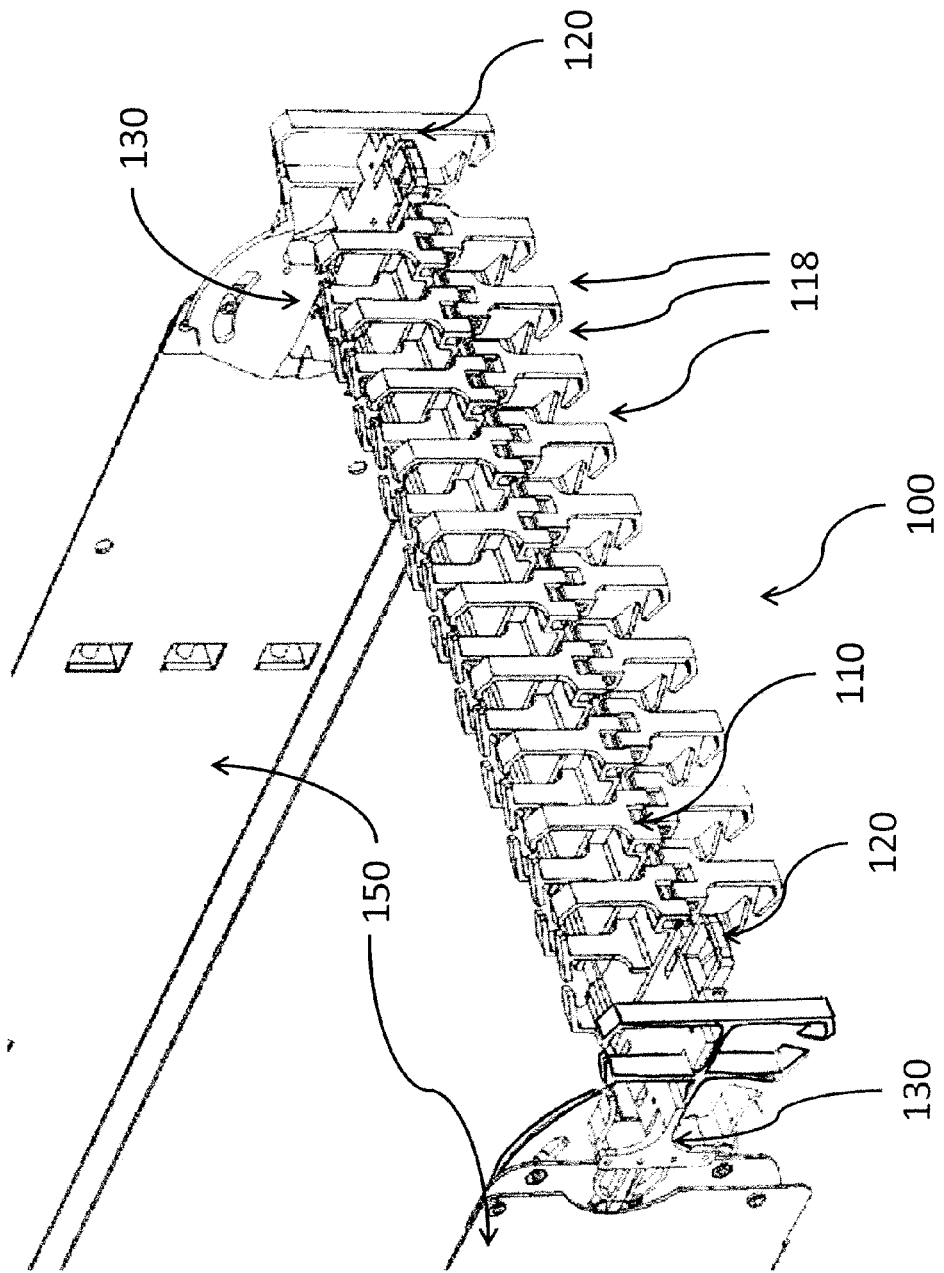
FIG. 5 illustrates a perspective view of an embodiment of the pivot mechanism with cable retention clips.

FIGS. 4 and 5 show perspective views of apparatus 100 mounted to a mounting rail 150. The apparatus 100 may be mounted to the rack 200 (FIG. 1) in a number of ways; such mounting method is not critical to the embodiment described herein. In some embodiments, the mounting rail 150 may be used to mount apparatus 100 to the rack 200 (FIG. 1) wherein the inner surface of the mounting rail 150 is configured to be a supporting rail for enclosure 300 (FIG. 1). In other embodiments, the mounting rail 150 may be mounted to enclosure 300 (FIG. 1) to facilitate mounting enclosure 300 (FIG. 1) to rack 200 (FIG. 1).

Figure 6:
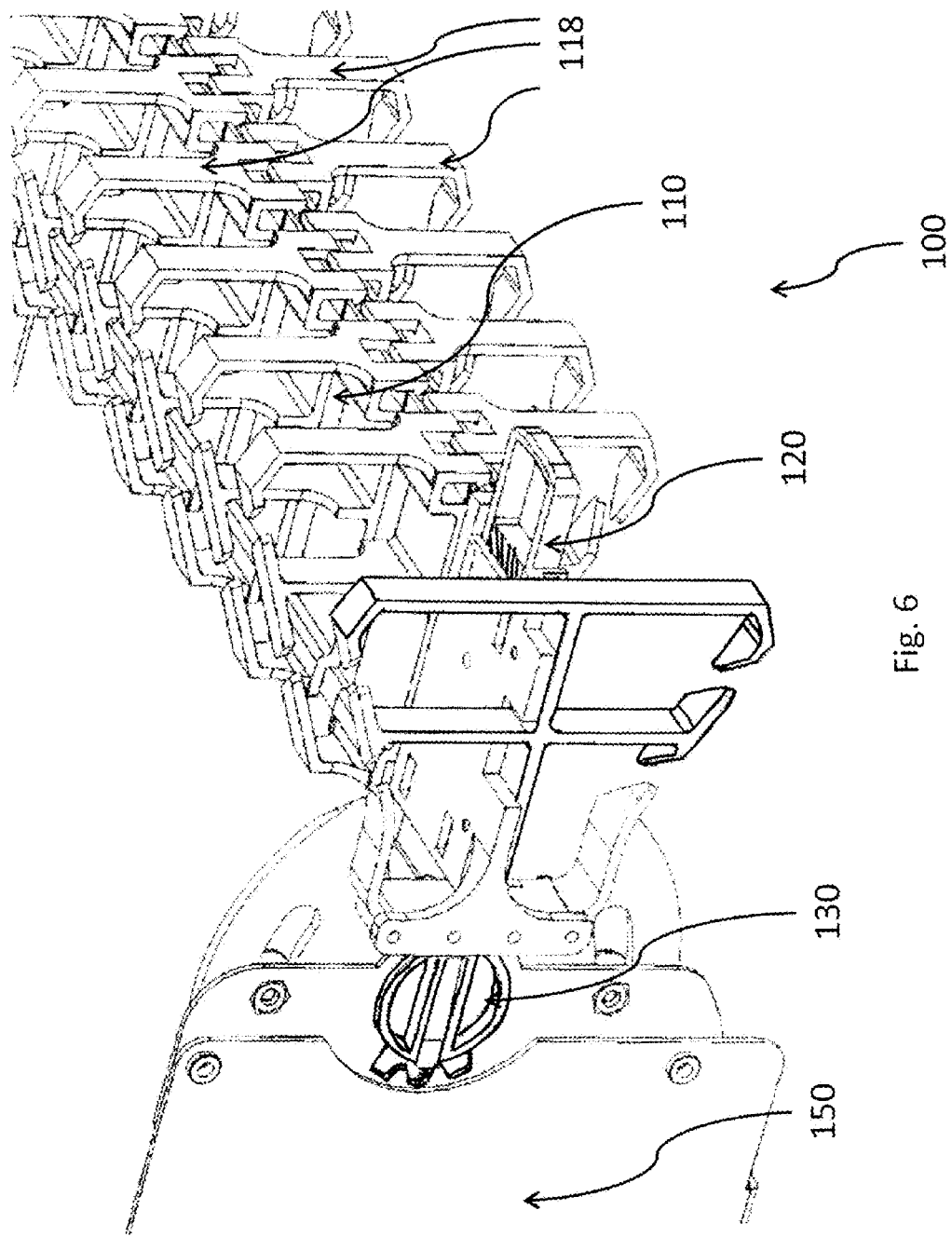
FIG. 6 illustrates a partial perspective view of one embodiment of the pivot mechanism.

FIG. 6 is a partial perspective view of one embodiment of pivot mechanism 130. As shown, the pivot mechanism is coupled to mounting rail 150 and the base member 110.

Figure 7:
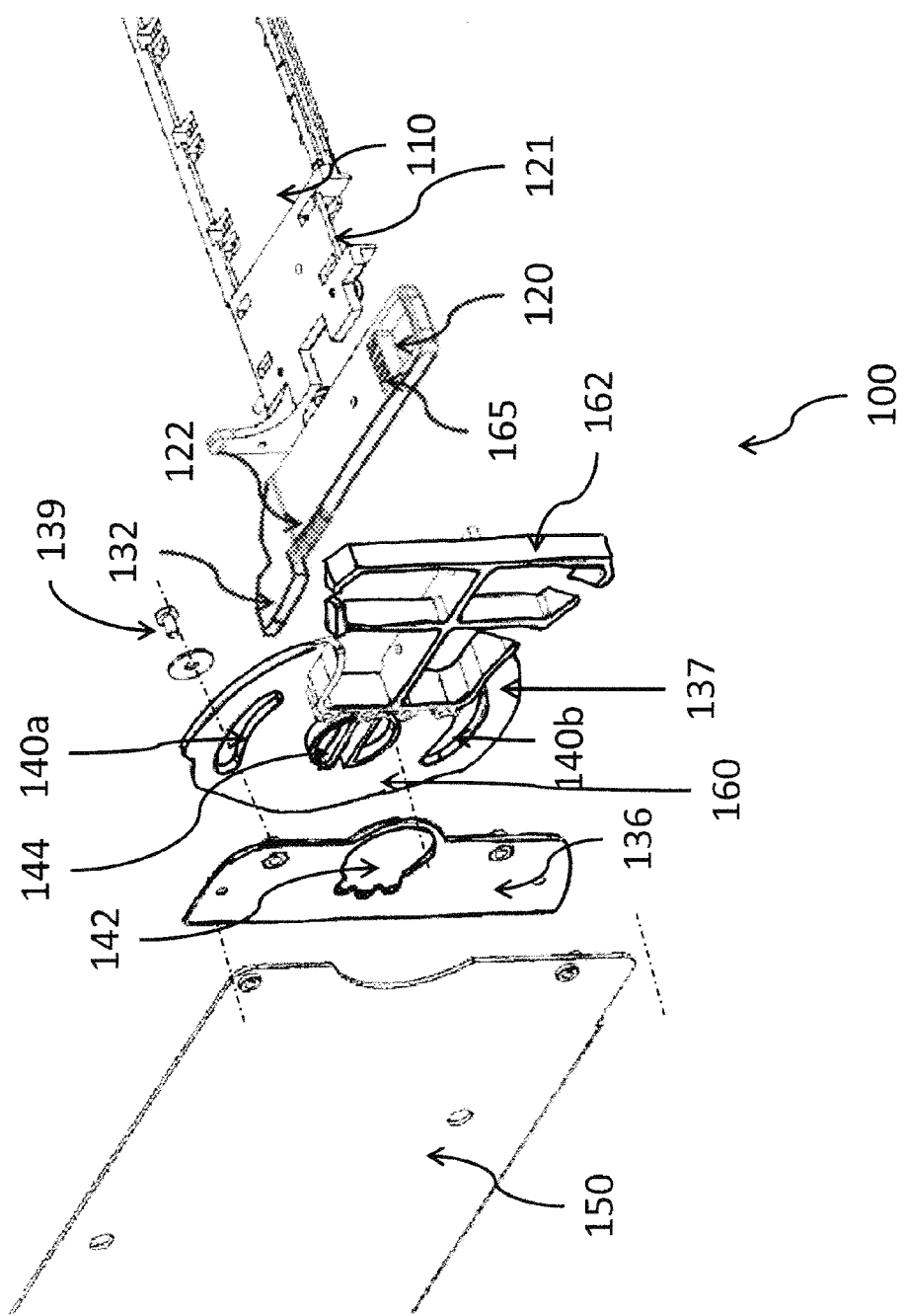
FIG. 7 illustrates an exploded view of the pivot mechanism.

FIG. 7 is an exploded view of the pivot mechanism 130 of apparatus 100. As shown, the pivot mechanism 130 (FIG. 6) comprises a mount 136, locking mechanism 137, a locking handle 120, and one or more mounting implements 139. One with skill in the art may recognize that mounting implements 139 may include screws, rivets, or other mounting devices. In this embodiment, locking mechanism 137 and locking handle 120 combine to form a tongue-and-groove mechanism. Locking handle 120 comprises tongue portion 132, and an aperture 142 formed in mount 136 comprises the groove portion of the tongue-and-groove mechanism. The tongue portion 132 is used as a locking pin for the locking mechanism 137 as described below. In this embodiment, locking handle 120 and tongue portion 132 are formed of a unitary structure, although it may be comprised of more than one piece.

Referring to FIG. 7, base member 100 includes a locking handle slot 121 constructed and configured to receive locking handle 120. Locking handle 120 is constructed and configured to be engageably coupled to locking mechanism 137 and able to move, within slot 121, relative to apparatus 100. In this embodiment, engagement spring 122 biases the tongue portion 132 into engagement with grooved portion of the aperture 142.

As shown in FIG. 7, locking mechanism 137 includes a disk 160 having slots 140a, 140b and axle 144. A cable retention end cap 162 is coupled to disk 160. Cable retention end cap 162 is configured to prevent interference to the locking mechanism 137 by cabling 320 (FIG. 1). In this embodiment, locking mechanism 137 is formed of a unitary structure, although one with skill in the art may recognize there may be multiple ways to combine disk 160, slots 140a, 140b, and axle 144. In this embodiment, axle 144 is formed from a raised portion of disk 160 to form a circular wall that is sized to fit and rotate within aperture 142. Axle 144 includes a slot portion 152 within which tongue portion 132 is slidably housed. Axle 144 is housed within aperture 142 and is constructed and configured to allow base member 110 to rotate relative to the pivot mechanism 130 (FIG. 6). Slots 140a, 140b facilitate the mounting of disk 160 of locking mechanism 137 to mount 136 using mount implements 139 and are configured to limit the range of rotation of base member 110 in relation to pivot mechanism 130 (FIG. 6).

Figure 8:
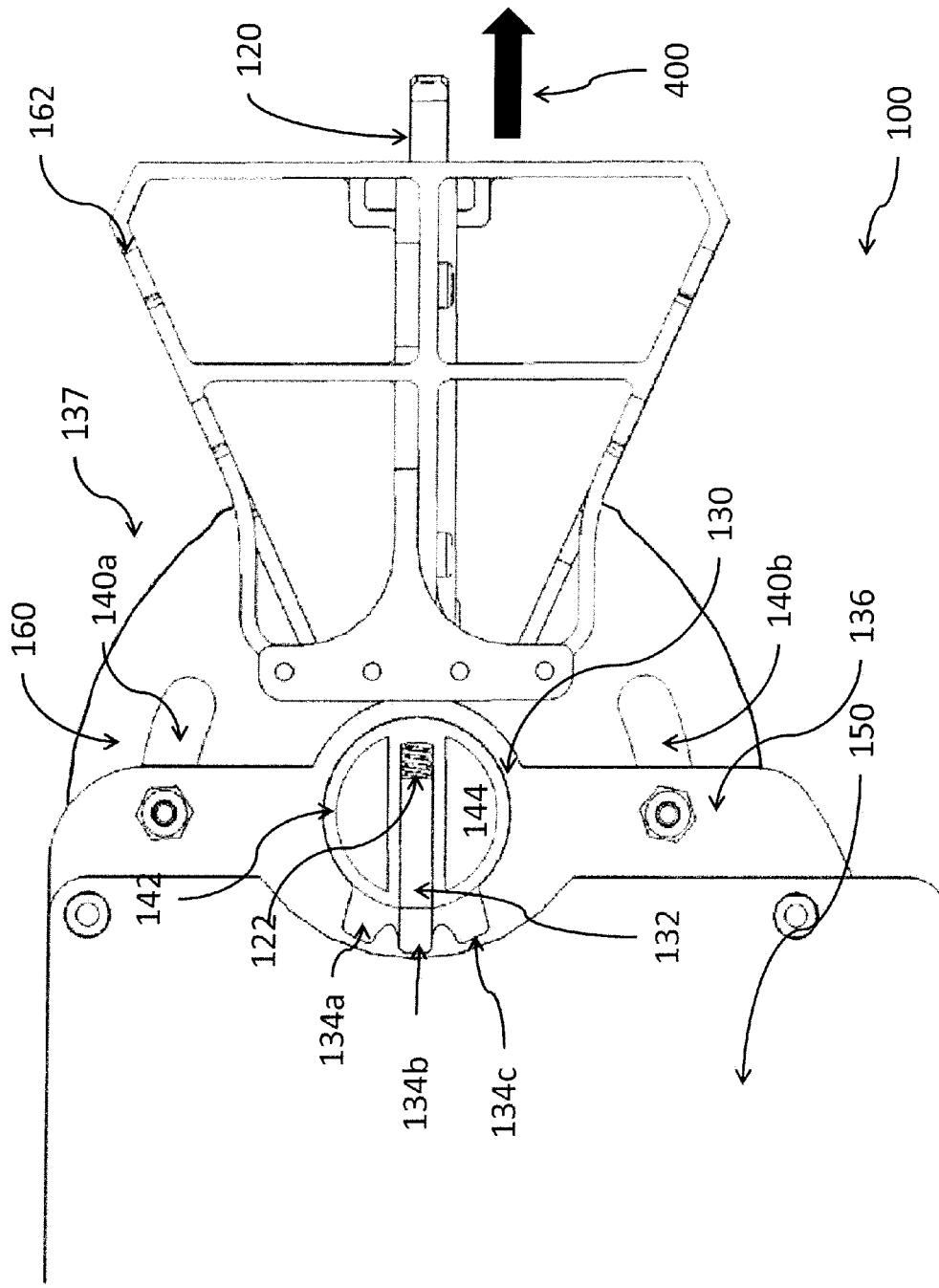
FIG. 8 illustrates a side view of the pivot mechanism in an embodiment of the invention.

FIG. 8 is a side view of the pivot mechanism 130 in an embodiment of the invention. As shown in FIG. 8, tongue portion 132 of the locking handle 120, engagement spring 122, locking mechanism 137, and mount 136 combine to control rotational movement of the base member 110 (FIG. 7). The mount 136 has three grooves or locking receiver slots 134a, 134b, 134c configured and constructed to receive the tongue portion 132 of the locking handle 120. As shown in FIG. 8, there are three levels of locking receiver slots 134a, 134b, 134c; wherein locking receiver slot 134a maintains the base member 110 (FIG. 7) in a lower position, locking receiver slot 134b maintains base member 110 (FIG. 7) in a level position, and locking receiver slot 134c maintains base member 110 (FIG. 7) in an upper position. In this figure, the engagement spring 122 exerts a force upon the tongue portion 132 forcing the tongue portion 132 into locking receiver slot 134b. Locking handle 120 may be moved in the direction denoted by the arrow 400 thereby causing the tongue portion 132 to move out of the locking receiver slots 134 to facilitate pivoting of the base member 110 (FIG. 7).

In this embodiment, when the locking handle 120 is moved in the direction shown by arrow 400, locking handle 120 disengages locking mechanism 137 within mount 136, by removing the tongue portion 132 from locking receiver slot 134b. When disengaged, the base member 110 (FIG. 7) may move in an arc-like motion relative to the pivot mechanism 130. When the locking mechanism 137 is engaged, thereby placing the tongue portion 132 in one of the locking receiver slots 134a, 134b, 134c of mount 136, the base member 110 (FIG. 7) is held in a fixed position relative to the pivot mechanism 130. In other embodiments, apparatus 100 may utilize any number of locking receiver slots for fine-tuning the position of the apparatus.

Figure 9:
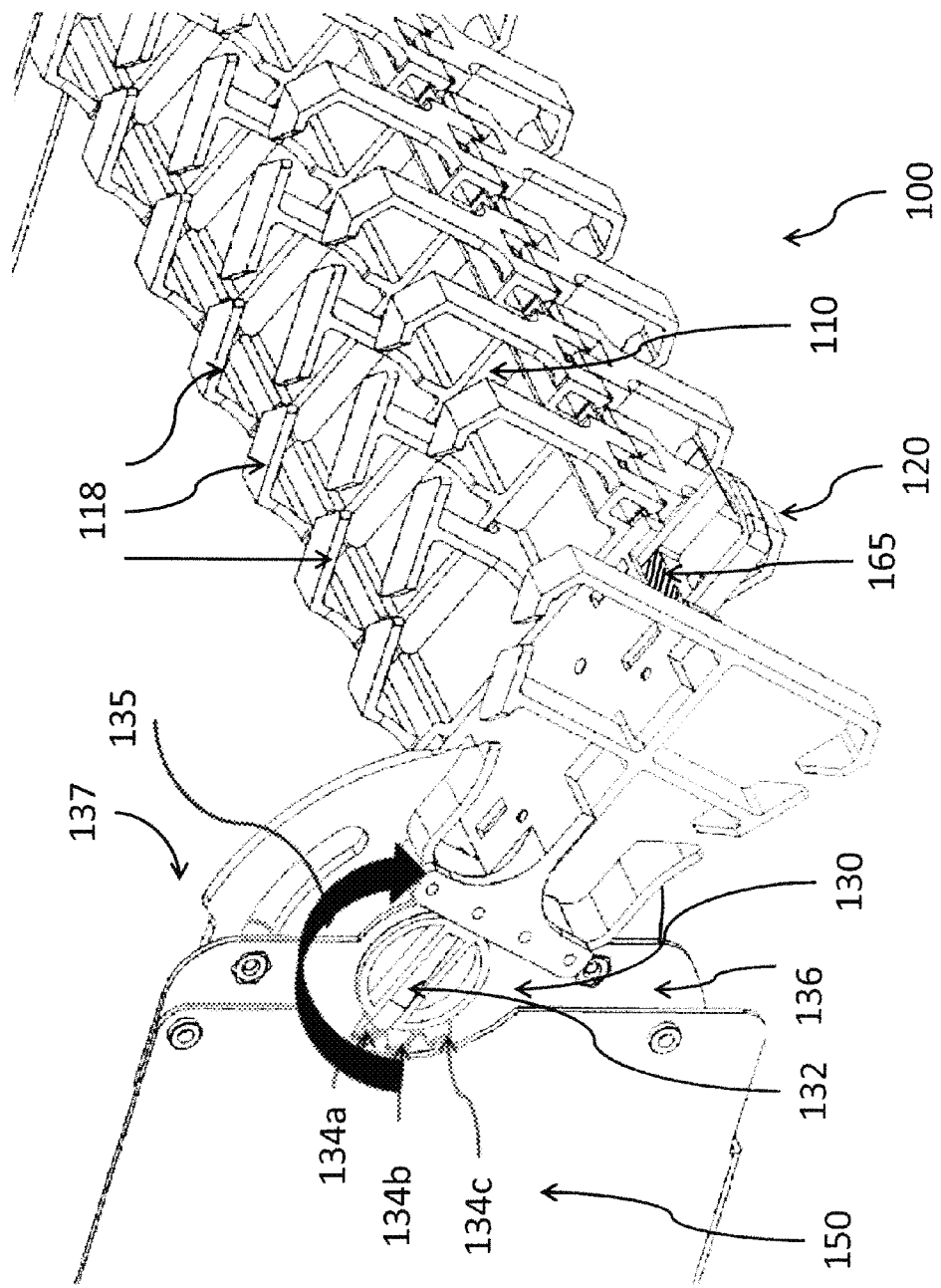
FIG. 9 illustrates a partial perspective view of the pivot mechanism in an embodiment of the invention.

FIG. 9 is a partial perspective view of the pivot mechanism 130. As shown, the locking mechanism 137 has been disengaged by pulling locking handle 120 away from base member 110, causing tongue portion 132 to be removed from locking receiver slot 134b of mount 136. When locking handle 120 is pulled away from base member 110, causing tongue portion 132 to be removed from locking receiver slot 134b of mount 136 a warning indicator 165 is exposed to the user as a warning that the locking mechanism is not engaged, i.e, not in one of the three locked positions, and thus, the apparatus is capable of position changes. This helps to insure that the apparatus will not be left in an unengaged state. Base member 110 is shown being able to move in a direction denoted by arrow 134, relative to the pivot mechanism 130. Although the base member 110 is shown moving in a direction of arrow 135, the base member is also enabled to move in a direction contrary to the direction of arrow 135.

Figure 10:
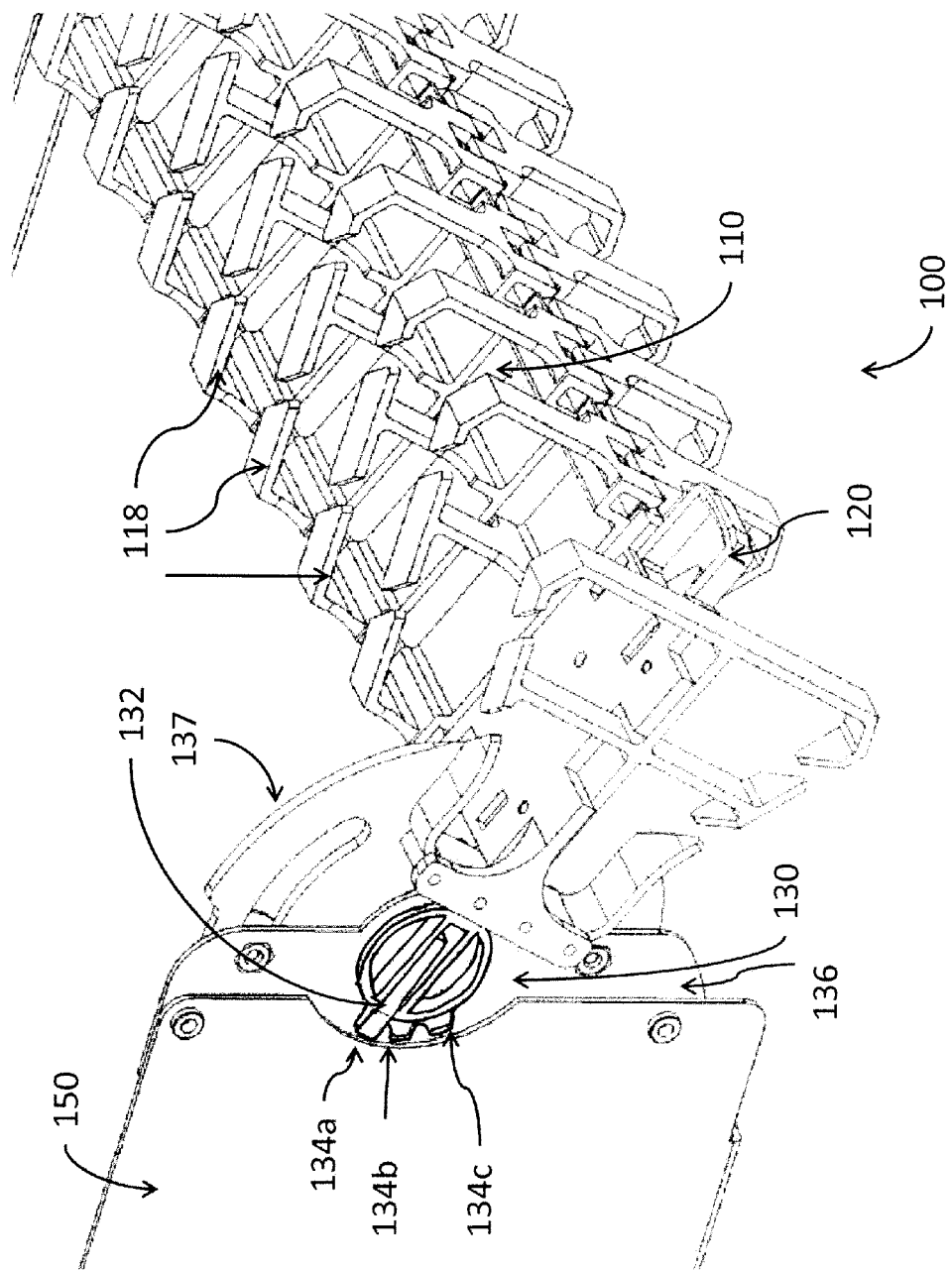
FIG. 10 illustrates a partial perspective view of the pivot mechanism in an embodiment of the invention.

FIG. 10 is a further partial perspective view of the pivot mechanism. As shown in FIG. 10, the locking handle 120 has been released, thereby locking the locking mechanism 137 by placing the tongue portion 132 of the locking handle 120 into locking receiver slot 134a of mount 136. In this embodiment, base member 110 is fixed in a lower position relative to the pivot mechanism 130.

Figure 11:
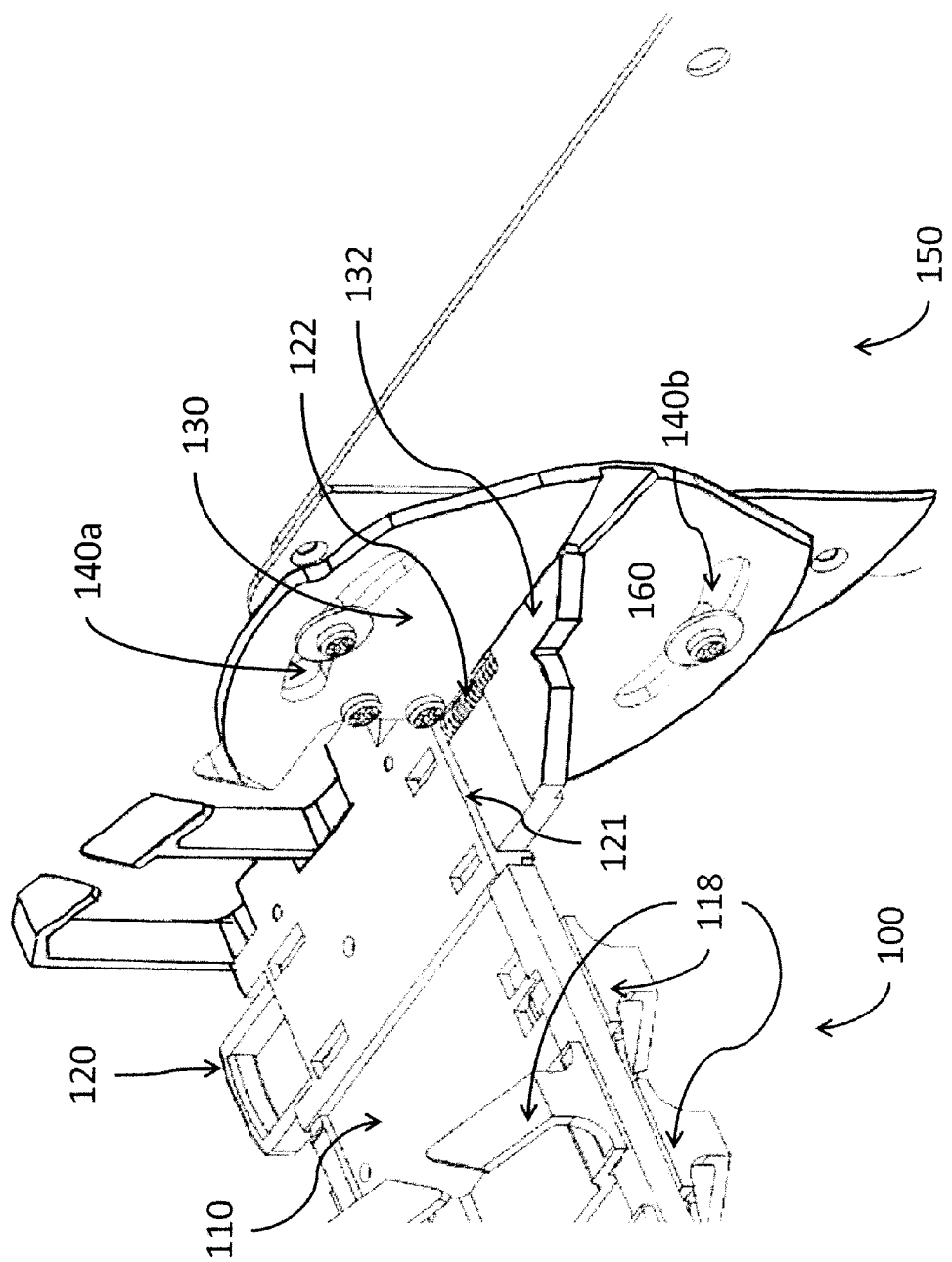
FIG. 11 illustrates a partial perspective view of the pivot mechanism in an embodiment of the invention

FIG. 11 is a partial interior perspective view of the pivot mechanism 130. The locking handle 120 is shown in an engaged state; tongue portion 132 of locking handle 120 is in locking receiver slot 134b (FIG. 10) of mount 136 (FIG. 10). In this state, the base member 110 is held in a fixed position relative to the pivot mechanism 130. As shown, the locking handle 120 is mounted to base member 110 within the locking handle slot 121. In this embodiment, engagement spring 122 is shown positioned between the tongue portion 132 of locking handle 120 and the base member 110 in a manner that biases the tongue portion into one of the slots 134.

Figure 12:
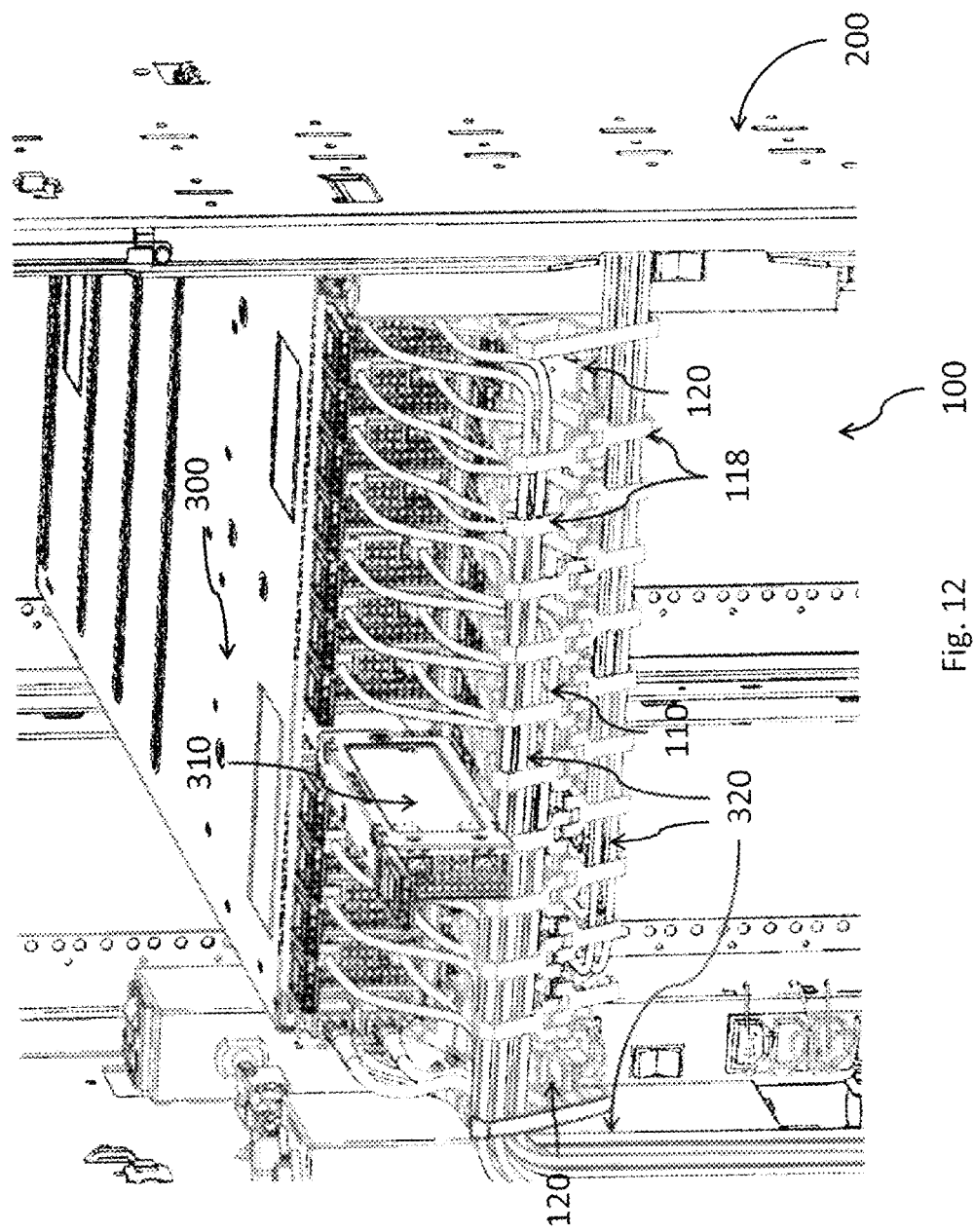
FIGS. 12 and 13 are perspective views of an embodiment of the apparatus mounted to the rack, showing how access is facilitated to a set of components.
Figure 13:
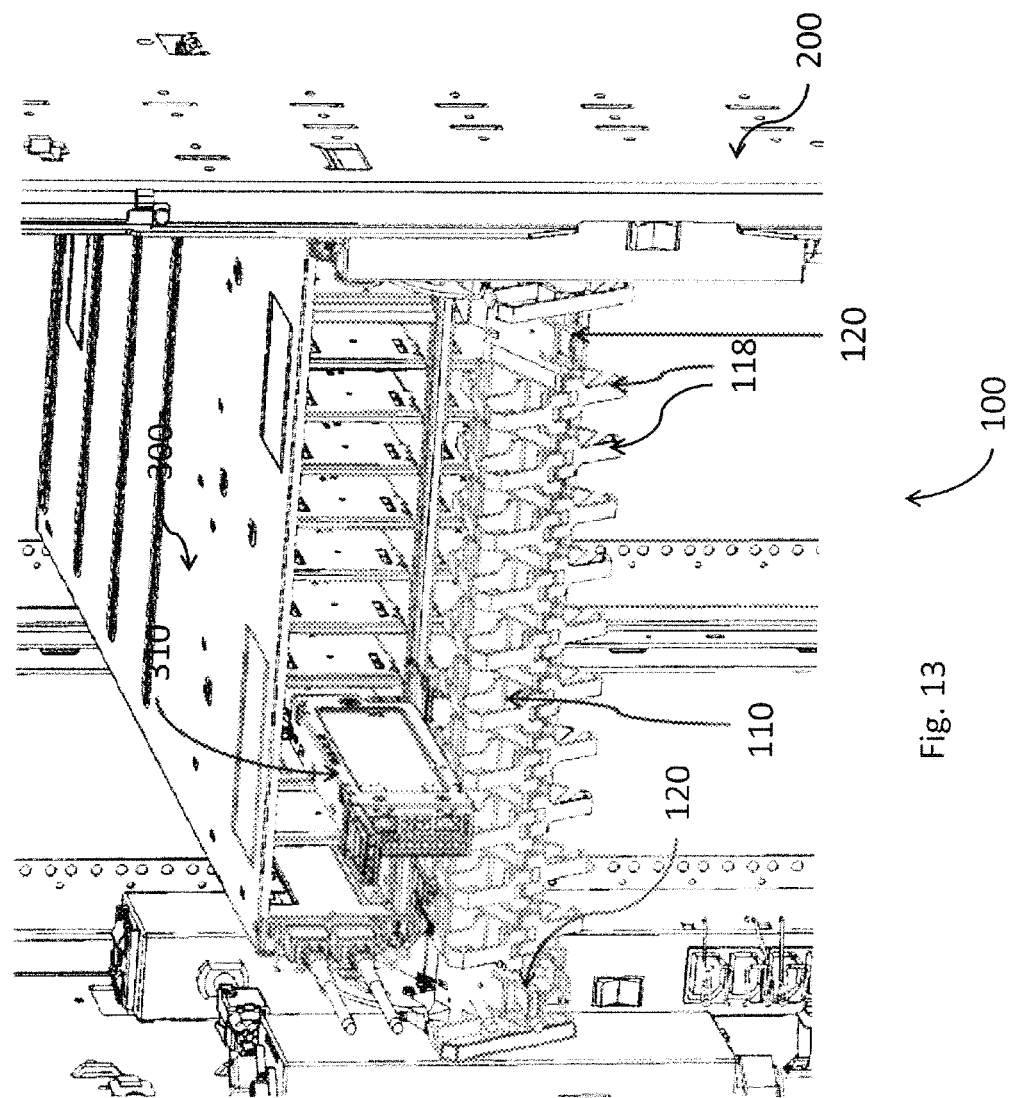

FIGS. 12 and 13 are perspective views of apparatus 100 being used in combination with a rack 200 and enclosure 300. In contrast to FIG. 1, wherein the base member 110 is in a first position in which tongue portion 132 of locking handle 120 is engaged with locking receiver slot 134 b of the respective locking mechanism 137, in both FIGS. 12 and 13, the base member 110 is held in a second position by the locking mechanism (not shown). In this second position base member 110 is pivoted downwardly, causing a first row of one or more components 310 to be accessible and therefore may be inserted, removed, or serviced without impedance from apparatus 100 or cables 320.

Figure 14:
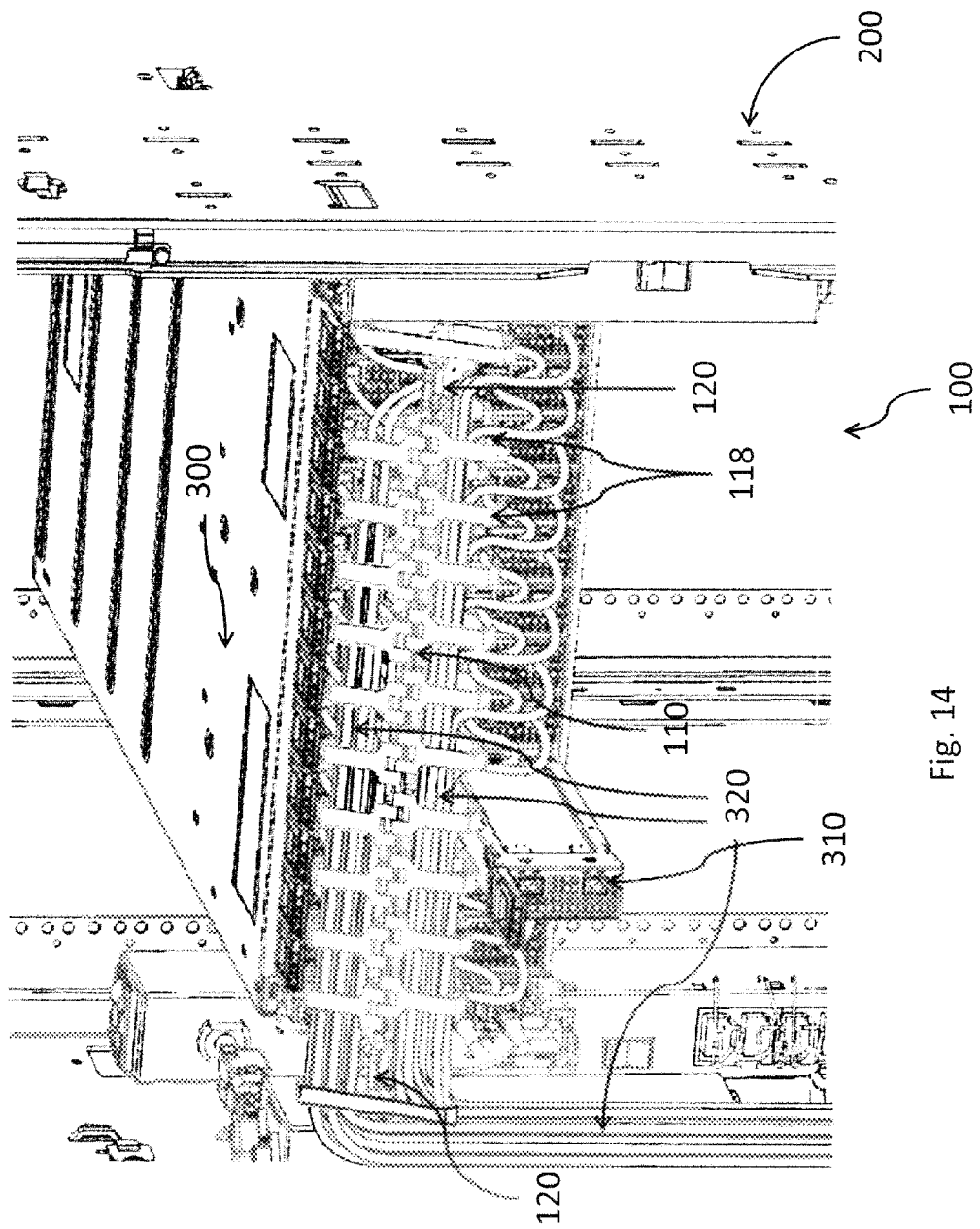
FIGS. 14 and 15 are perspective views of an embodiment of the apparatus mounted to the rack, showing how access is facilitated to a set of components.
Figure 15:
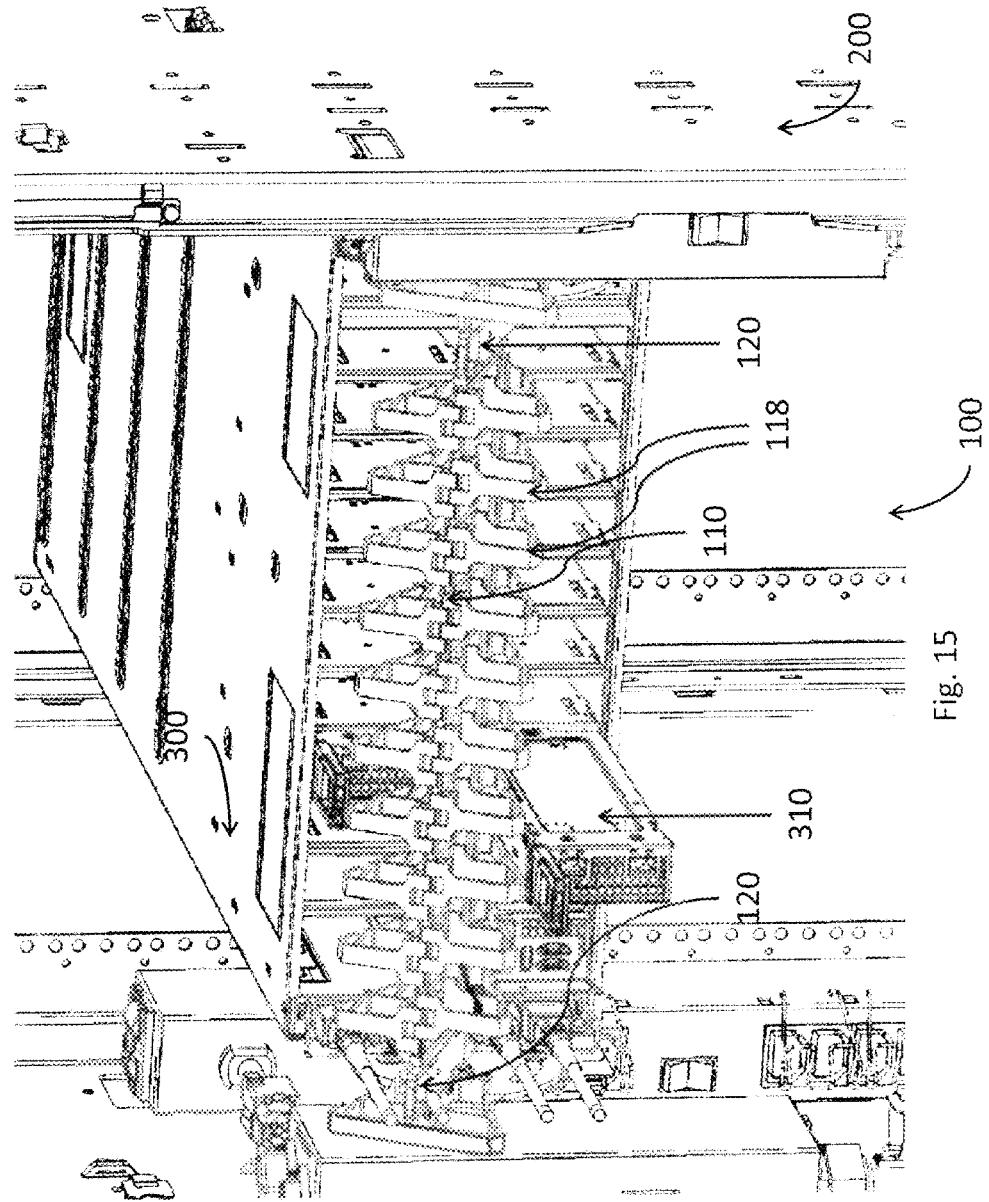

FIGS. 14 and 15 are perspective views of apparatus 100 being used in combination with rack 200 and enclosure 300. In both FIGS. 14 and 15, the base member 110 is placed into a third position, in contrast to the first position shown in FIG. 1 and the second position shown in FIGS. 12 and 13. In this third position, base member 110 is pivoted upwardly, causing a second row of one or more components 310 to be accessible and therefore may be inserted, removed, or serviced without impedance from apparatus 100 or cables 320.

Although the foregoing invention has been described in some detail for purposes of clarity of understanding, it may be apparent that certain changes and modifications may be practiced within the scope of the appended claims. For example, while the apparatus is described and shown as including two pivot mechanisms 130, apparatus 100 could have a single pivot mechanism 130 at one end and a non-locking pivot mechanism at the opposite end. Further, base portion 110 could be mounted to pivot mechanism 130 via a parallelogram or similar configuration to enable upward and downward movement of base portion 110 without causing tilting of base portion 110. The actual path of base portion 110 may be varied, as long as it is movable to positions that facilitate access to the components by moving the associated cables away from them. Accordingly, the present implementations are to be considered as illustrative and not restrictive, and this invention is not to be limited to the details given herein, but may be modified within the scope and equivalents of the appended claims. Numerous alternative embodiments within the scope of the appended claims will be readily apparent to those skilled in the art.

In the foregoing specification, this invention has been described with reference to specific exemplary embodiments thereof. It may, however, be evident that various modifications and changes may be made to the specific exemplary embodiments without departing from the broader spirit and scope of this invention as set forth in the appended claims. Accordingly, the specification and drawings are to be regarded in an illustrative rather than a restrictive sense.

What is claimed is:

1. An apparatus for facilitating access to one or more components mounted in a rack the components having one or more cables connected thereto, the apparatus comprising:
    a base member, having a first end and a second end, the base member being constructed and arranged for securing cables thereto; and
    at least one pivot mechanism coupled between the first end of the base member and the rack, the pivot mechanism including a pivot enabling rotation of the base member relative to the rack;
    wherein the rotation of the base member relative to the rack comprises:
        a first state, wherein the base member is maintained in a first position wherein access to the one or more components is prevented by cables secured to the base member; and
        a second state, wherein the base member is maintained in a second position, wherein the base member is rotated relative to the rack to facilitate access to the one or more components;
    wherein the rack has a first row and a second row each capable of housing one or more components, the rotation of the base member relative to the rack further comprises a third position, opposite the second position relative to the first position, wherein the base member is rotated relative to the rack to facilitate access to the second row of one or more components, while preventing access to the first row of one or more components.

2. The apparatus of claim 1, wherein movement of the base member between the first position and the second position includes movement of the base member along an arc relative to the pivot.

3. The apparatus of claim 1, wherein the at least one pivot mechanism further comprises:
    a mount configured to attach the pivot mechanism to the rack;
    a locking apparatus, coupled to the mount, configured to maintain the base member in one of the first or second positions, with respect to the mount; and
    a locking handle, engageably coupled to the locking apparatus, constructed and configured to engage and disengage the locking apparatus.

4. The apparatus of claim 3, wherein the locking apparatus further comprises a locking pin, having an engaged and unengaged state; the locking in an unengaged state enables movement, by the base member, along an arc relative to the pivot; the locking pin in an engaged state restricts the movement of the base member.

5. A system, comprising:
    an enclosure;
    one or more components disposed within a first and second row of the enclosure;
    a rack, having an inner space configured to receive the first and second row of one or more components; and
    an apparatus for facilitating access to the first row of one or more components, the apparatus comprising:
        a base member, having a first end and a second end, the base member being constructed and arranged for securing one or more cables thereto; and
        at least one pivot mechanism coupled between the first end of the base member and the rack, the pivot mechanism including a pivot, enabling rotation of the base member relative to the rack;
        wherein the rotation of the base member relative to the rack comprises:
            a first state, wherein the base member is maintained in a first position wherein access to the one or more components is prevented by cables secured to the base member; and
            a second state, wherein the base member is maintained in a second position, wherein the base member is rotated relative to the rack to facilitate access to the first row of one or more components;
        wherein the rotation of the base member relative to the rack further comprises a third state, wherein the base member is maintained in a third position, opposite the second position relative to the first position, wherein the base member is rotated relative to the rack to facilitate access to the second row of one or more components, preventing access to the first row of one or more components.

6. The system of claim 5, wherein movement of the base member between the first position and the second position includes movement of the base member along an arc relative to the pivot.

7. The system of claim 5, wherein the at least one pivot mechanism further comprises:
    a mount configured to mount the pivot mechanism to the rack;
    a locking apparatus, coupled to the mount, configured to hold the base member in a fixed position, with respect to the mount; and
    a locking handle, engageably coupled to the locking apparatus, constructed and configured to engage and disengage the locking apparatus.

8. The system of claim 7, wherein the locking apparatus further comprises a locking pin, having an engaged and unengaged state; the locking in an unengaged state enables movement, by the base member, along an arc relative to the pivot; the locking pin in an engaged state restricts the movement of the base member.

9. An apparatus for facilitating access to one or more components in a rack, the apparatus comprising:
    a base member, having a first end and a second end, the base member being constructed and configured to have one or more retaining clips coupled to the base member for securing one or more cables thereto;
    one or more pivot mechanisms, wherein one of the one or more pivot mechanism is coupled between the first end of the base member and the rack; the one or more pivot mechanism, having a pivot, enabling the rotation of the base member relative to the rack;
    wherein the one or more pivot mechanisms further comprises:
        one or more mounts configured to mount the one or more pivot mechanism to the rack,
        one or more locking apparatus, coupled to the mount, configured to hold the base member in a fixed position, with respect to the mount; and one or more locking handles, engageably coupled to the locking apparatus, constructed and configured to engage and disengage the locking apparatus;

wherein the locking apparatus further comprises a locking pin, having an engaged and unengaged state; the locking pin in an unengaged state enables movement, by the base member, along an arc relative to the pivot; the locking pin in an engaged state restricts the movement of the base member.

* * * * *